United States Patent [19]
Tanaka

[11] 3,971,991
[45] July 27, 1976

[54] TELEVISION TUNING SYSTEM WITH VARACTOR MALFUNCTION DETECTION

[75] Inventor: Akio Tanaka, Evanston, Ill.

[73] Assignee: Zenith Radio Corporation, Chicago, Ill.

[22] Filed: Sept. 4, 1974

[21] Appl. No.: 503,122

[52] U.S. Cl. .............................. 325/464; 325/459; 325/470
[51] Int. Cl.² ........................................... H04B 1/16
[58] Field of Search ......................... 325/418–423, 325/452–453, 457–459, 462–465, 468–470; 334/11, 14–16; 340/147 C, 171 A, 168 R

[56] References Cited
UNITED STATES PATENTS

| | | | |
|---|---|---|---|
| 3,611,152 | 10/1971 | Sakai | 325/421 |
| 3,736,513 | 5/1973 | Wilson | 325/421 |
| 3,818,353 | 6/1974 | Sakamoto | 325/457 |
| 3,845,394 | 10/1974 | Hamada | 325/464 |

Primary Examiner—Robert L. Griffin
Assistant Examiner—Jin F. Ng
Attorney, Agent, or Firm—Joseph T. Downey; Nicholas A. Camasto

[57] ABSTRACT

An all channel television varactor diode tuning system has a presettable counter for deriving the number of the receivable television channel by counting pulses indicative of the tuner local oscillator frequency, which is varied by a voltage ramp circuit under the control of a comparator. The derived channel number is supplied to one input of the comparator, and a channel number selector supplies an encoded desired channel number to the other comparator input and to a frequency band decoder. The band decoder supplies signals to establish appropriate preset counts for the counter in accordance with the frequency band. Malfunction detection circuitry for detecting an improper number of pulses for the presettable counter, when in the low VHF frequency bands, is coupled to the channel number selector and connected through the comparator to force the tuning voltage circuit to drive the varactor in a direction opposite to that indicated by the comparator. This is done by monitoring the tens digit in the counter for occurrence of an 8 or 9.

11 Claims, 2 Drawing Figures

TELEVISION TUNING SYSTEM WITH VARACTOR MALFUNCTION DETECTION

CROSS REFERENCE TO RELATED PATENT APPLICATIONS

This application is related to the following patent and applications all of which are assigned to the assignee of the present application and all of which are hereby incorporated by reference. U.S. Pat. No. 3,851,254, entitled "Digital Systems and Method for Determining and Displaying a Television Channel Number," in the names of Richard G. Merrell and Akio Tanaka, Ser. No. 430,446, filed Jan. 3, 1974, entitled "Channel Seeking Tuning System," in the name of Akio Tanaka (hereafter referred to simply as Tanaka application), U.S. Pat. No. 3,931,579 entitled "Digital Signal Seeking Tuning System," in the names of John Ma and Akio Tanaka, Ser. No. 466,579, filed May 3, 1974, entitled "All Electronic Digital Tuner System with Memory" in the names of John Ma and Akio Tanaka, Ser. No. 484,475, filed July 1, 1974, entitled "Band Decoder for All Channel Digital Tuning System" in the name of Akio Tanaka, and Ser. No. 492,365, filed July 29, 1974, entitled "Signal Seeking Tuning System with Illegal Channel Detection" in the name of Akio Tanaka.

BACKGROUND OF THE INVENTION

The present invention relates generally to all channel television tuning systems and more particularly to a varactor diode tuning system having a time sequenced presettable counting system for determining the system tuning condition by counting the frequency of a tunable element such as a local heterodyne oscillator.

Tuning of broadcast frequencies with a tuned circuit employing a varactor diode in combination with an inductor is accomplished by varying the voltage across the diode to produce a change in its capacitance. The current and voltage characteristics of varactor diodes are well known. The capacitance exhibited varies as a function of the reverse bias voltage applied across their terminals. Since the diodes operate in the depletion mode, the larger the reverse bias, the smaller the capacitance exhibited. When used for the low VHF television frequencies, the bias voltage (tuning voltage) is small (high capacitance) and certain temporary operating conditions may give rise to an unstable operating environment for the oscillator, which may be manifested by very weak oscillator output or intermittent oscillatory operation. In either situation, the number of pulses counted by the counting means for a given tuning voltage may be substantially less than that actually generated, or supposed to be generated. With the large preset counts used for the low VHF bands, a temporary malfunction of this nature could produce an insufficient number of pulses for the counter resulting in an indication of tuning to a very high channel number (frequency) whereas, in fact, the opposite situation prevails. Under this condition the comparator would drive the tuning voltage in a direction opposite to that which is actually required, and the system coulld "lock up" and render the temporary malfunction permanent.

Specifically, in the above-mentioned Tanaka application the preset count is 85 for the low VHF bands and, for example, channel 2 would require counting 17 CU pulses from the modular scaler. If only 13 CU pulses were counted, the derived channel number would give an indication of the system being tuned to channel 98 and system response (driving the voltage even lower in an effort to tune to channel 2) could result in extinguishing oscillation.

OBJECTS OF THE INVENTION

An object of this invention is to provide a novel all channel television tuning system.

It is another object of this invention to provide an improved all channel varactor diode tuning system.

SUMMARY OF THE INVENTION

In accordance with the invention a television tuning control system comprises a varactor diode tuner coupled to a tuning frequency counting means for deriving from the frequency of the varactor diode tuning element information indicative of the channel number of the television signal to which the tuner is tuned. The system further includes comparison means coupled between the tuning frequency counting means and a channel number selection means for comparing the channel number information therebetween, and controlling tuning voltage means which drives the varactor diode tuning element. Channel band determination means establish preset counts for the tuning frequency counting means and, with the channel number selection means, supplies information to malfunction detection means which detects an improper number of pulses and forces the tuning voltage means to drive the varactor diode in a direction opposite to that indicated by the comparison means.

BRIEF DESCRIPTION OF THE DRAWINGS

The features of the present invention which are believed to be novel are set forth with particularity in the appended claims.

The invention, together with further objects and advantages thereof, may best be understood by reference to the following description taken in conjunction with the accompanying drawings, in the several figures of which like reference numerls identify like elements, and in which.

DESCRIPTION OF THE PREFERRED EMBODIMENT

Figure 1:
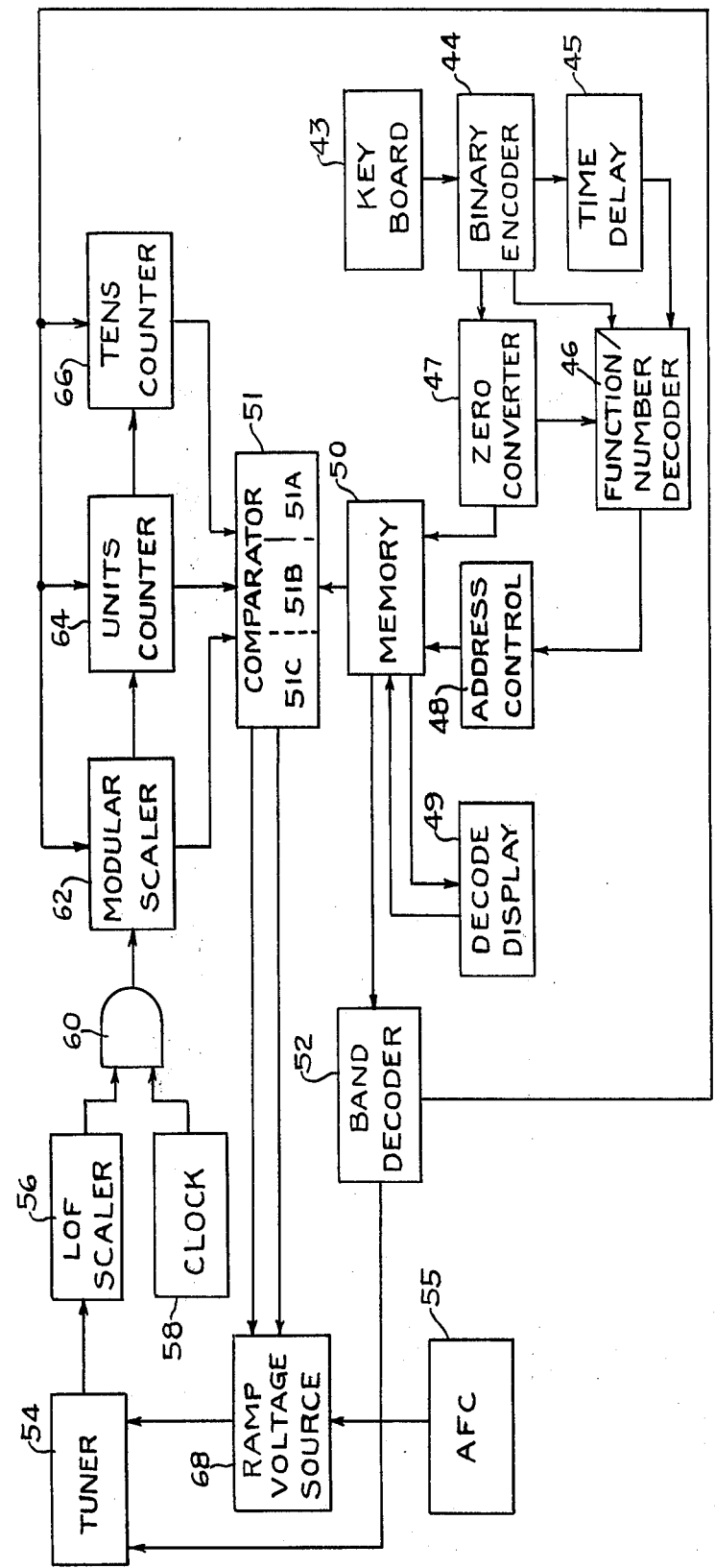
FIG. 1 depicts, in block diagram form, a tuning system employing the invention.

FIG. 1 is a block diagram depicting a tuning system constructed in accordance with the invention. A channel number keyboard 43 includes means for entering either desired channel number information or tuning commands to tune the tuner. The keyboard information is encoded into a special binary representation in encoder 44, supplied to a zero converter 47 and, both directly and through a time delay system 45, to a function/number decoder 46. The purpose of time delay system 45 is to eliminate spurious signals which might be generated by keyboard contact bounce. The directly supplied information to decoder 46 assists in the determination of the proper address or position in a memory 50. Zero converter 47 functions to alter the special binary representation used in the encoder to the standard binary representation employed in the remainder of the system. The output of zero converter 47 supplies channel number information in standard binary form to the designated position in memory 50.

The keyboard input can be either a channel number digit or an Up or Down tuning command. The word "command" is used throughout to indicate an Up or Down signal input. the function/number decoder firstly determines which of an Up or Down command has been given and secondly distinguishes between commands and channel numbers. If an Up or Down command is entered at the keyboard, address control 48 causes an advance to the next position of the memory. Additional commands result in address control 48 sequentially indexing memory 50 through its available memory positions. Connected to the output of memory 50 is a decode display 49 which provides a visual indication of the channel number at that memory address. Thus, the viewer receives a visual indication of the selected channel information.

The tuning system has two functional modes designated program and operate. In the program mode, information is entered by the keyboard and stored in the memory by use of the Up and Down commands which cause a serial advancement of accessible memory address positions, whereupon the channel number information is supplied from the keyboard. In the operate mode, an Up or Down command causes advancement to the next sequential address position and information is supplied from the memory to a comparator 51 to cause tuning to the channel represented by the stored channel information. In this mode, a "scratch pad" memory position is automatically accessed upon the input of a channel number and permits direct tuning by the viewer to any selected channel.

Another output of memory 50 is connected to a band decoder 52 which determines, from the encoded channel information stored in memory 50, 1) in which of the several discontinuous frequency bands the selected channel is; 2) Whether UHF or VHF circuitry in the tuner is activated; and 3);41;or the preset information supplied to the channel computing means for decoding of the oscillator frequency. Thus, an output of band decoder 52 is connected to a varactor tuner 54 and another output is connected in common to a modular scaler 62, a units counter 64 and a tens counter 66. A conventionally derived automatic frequency control voltage source (AFC) 55 is coupled to a ramp voltage source 68 for maintaining the oscillator frequency tuned to the received signal picture carrier frequency.

The output of a local oscillator frequency (LOF) scaler 56 and the output of a clock pulse generator 58 are coupled to the inputs of a logic gate 60. The signal on the output of gate 60 constitutes the tuning information and comprises a train of oscillator frequency-related pulses in fixed time intervals. The oscillaator frequency is determined by counting the number of pulses in an interval. The output of logic gate 60 is connected to modular scale 62 which, in turn, is connected to units counter 64 which, in turn, is connected to tens counter 66. On a time sample basis, the tuning information is supplied to the appropriately preset modular scaler and counters which, in the preferred embodiment, determine the channel number corresponding to the television frequency to which the tuner is tuned. The circuitry from the LOF scaler to the comparator constitutes the channel computing means.

The outputs of modular scaler 62 and counters 64 and 66 are connected to comparator 51 which has a modular section 51C, a units section 51B and a tens section 51A, where the derived channel number is compared with the desired channel number. As each comparison is made, signals dependent upon the condition of comparator 51 coupled to ramp voltage source 68 for controlling both the tuning voltage direction and rate of change. the output voltage from ramp voltage source 68 drives the tuner 54 to make corrective changes in its local oscillator frequency, until comparator 51 indicates equality between the derived channel number and desired channel number and, as fully described in the above mentioned Tanaka application, that the tuned signal is within a range of frequencies preselectd by a "window."

Definitions

For simplicity, only logic connections are shown in the figures and only voltage sources and grounds necessary to establish the logic control signal levels are shown. Posit.ve logic is used throughout and logic gates are simply referred to by their functional names, i.e., AND, NAND, OR and NOR, without the word "gate". A 1 represents a high logic (or signal voltage) level and a 0 corresponds to a low logic level. Thus, an AND gate has its output at 1 only if all inputs are at 1; a NAND gate has its output at 0 only if all inputs are at 1; an OR gate has its output at 1 if any input is at 1; and a NOR gate has its output at 0 if any input is at 1. Inverters function to interchange the 1 and 0 levels.

All binary representations are conventionally arranged in descending powers of 2 from left to right. Leads labelled D, B, C and A interchangeably represent binary digits or bits as well as lead identification. Similarly leads may be identified by the functional signals they carry.

The terms "input" and "output" generally indicate the device terminal unless signal is specified. An open circle on an input terminal designates a negative edge triggered device. $\phi$ represents a timing pulse signal and $\bar{\phi}$ its inverse or complement. If $\phi$ is 0, $\bar{\phi}$ is 1 and vice-versa. The term "inhibit" indicates the condition in which a gate output is no longer dependent upon signals applied to its remaining inputs. The term "enable" designates the condition in which a gate output is dependent upon the signals applied to the remaining inputs.

Figure 2:
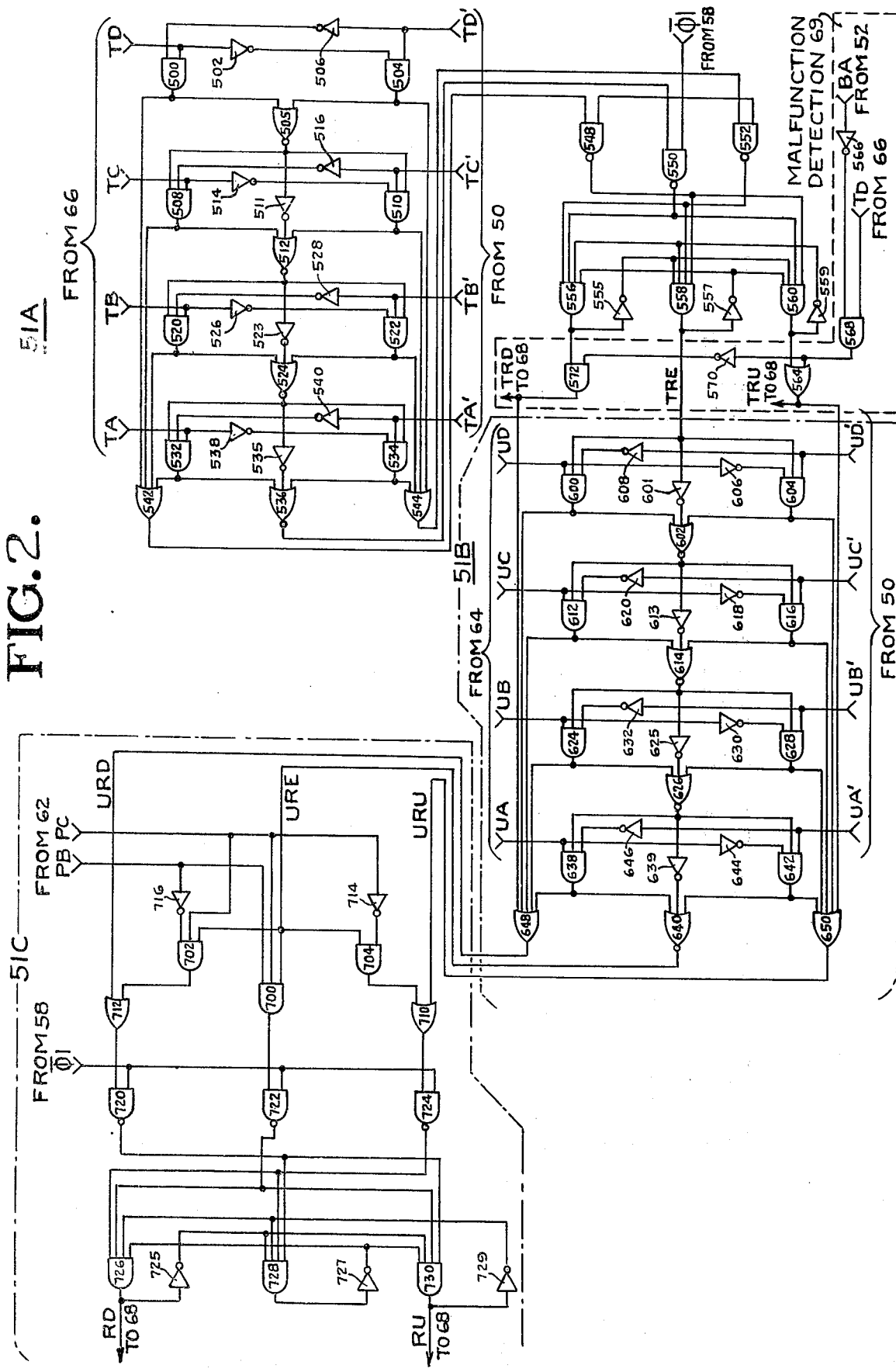
FIG. 2 shows the circuitry of block 51 which comprises the comparator for the system including the malfunction detection circuitry 69.

Tens Comparator 51A (FIG. 2)

FIG. 2 shows the tens comparator circuitry which compares the binary representation of the tens digit of the derived channel number in the counter with the binary representation of the tens digit of the channel number in the memory. It is a sequential bit comparator having four bit comparison stages with each stage comprising two AND gates (one each for the counter and the memory) with their outputs coupled to a NOR gate. One AND is supplied with a signal from the counter and an inverted signal from the memory and the other AND is supplied with a signal from the memory and an inverted signal from the counter. The output signal of the counter AND gate in each stage is also supplied as an input signal to one of the four inputs of a tens counter OR gate. Similarly, the output signal of the memory AND gate in each stage is supplied as an input signal to one of the four inputs of a tens memory OR gate. When either the counter or memory OR gate is inhibited it produces a 1 level output which indicates that its binary bit string is greater in magnitude (represents a larger decimal number) than the other. The tens memory OR and tens counter OR produce a tens ramp up (TRU) and tens ramp down (TRD) signal, respectively, for direct application to the appropriate tens transmission gate in ramp generator 68. The TRD and TRU signals are also supplied to the units comparator, along with a tens equal (TRE) signal.

Tens comparator 51A sequentially performs a bit-by-bit comparison of the tens digits beginning with the most significant binary bit (TD, TD') and ending with the least significant binary bit (TA, TA'). If the comparison between corresponding bits in the most significant stage results in a determination of inequality with, for example, the counter being high, an inhibiting control signal is sent to one input of the counter OR, which results in a ramp down control voltage (TRD). If equality is determined, one input or both OR gates is enabled and further control of the gates is transferred to the next bit stage of the comparator; by the NOR gate of the stage enabling the AND's and the NOR of the next stage. It is this sequential mode of comparison, achieved by inhibiting the AND's and NOR of subsequent stages until equality exists in the higher order stages, which determines the direction of the difference in the tens binary bit and, therefore, the direction of the ramp control voltage developed in voltage source 68.

The tens comparator also includes a three state tri-flop for indicating that the corresponding binary signal from the tens counter is greater than, less than, or equal to the corresponding binary signal from the tens memory. The tri-flop functions to interrogate the tens comparator during the compare interval and remains in its last determined state until another comparison has been made.

In the first stage, TD (from the tens counter 66) is connected to an input of a first stage AND 500 and, through an inverter 502, to an input of a first stage AND 504. TD' (from tens memory 176) is connected to the second input of AND 504 and, through an inverter 506, to the second input of AND 500. A 1 level output signal from AND 500 is obtained when TD is at 1 and TD' is at 0, while a 1 level output signal from AND 504 is obtained when TD is at 0 and TD' is at 1. TD at 1 corresponds to binary 1XXX and indicates a channel number of 80 or higher. The output of AND 500 is connected to one input of a first stage NOR 505 and to one input of a four input tens counter OR 542. AND 504 is connected to a second input of NOR 505 and to one input of a four input tens memory OR 544. The output of NOR 505 is connected directly to the inputs of second stage AND's 508 and 510, and, through an inverter 511, to one input of a second stage NOR 512 and will be seen to enable the second stage gates when equality exists in the first stage. It will be noted that the comparison occurs independent of any timing signals and consequently the comparator is functioning all of the time.

In the second stage, TC is connected to another input of AND 508, and, through an inverter 514, to another input of AND 510 while TC' connects to the third input of AND 510 and, through an inverter 516, to the third input of AND 508. The output of AND 508 is connected to another input of NOR 512 and to a second input of tens counter OR 542. Similarly, the output of AND 510 is coupled to the third input of NOR 512 and to a second input of tens memory OR 544. Lastly, the output of NOR 512 connects to inputs of third stage AND's 520 and 522, and, through an inverter 523, to an input of a third stage NOR 524.

In the third stage, TB and TB' are similarly connected to counter and memory AND's 520 and 522, with inverters 526 and 528. The outputs of AND's 520 and 522 are connected respectively to inputs of NOR 524 and to third inputs of OR's 542 and 544. NOR 524 is coupled to the inputs of the fourth stage AND's 532 and 534, and, via an inverter 535, to one input of a tens equality NOR 536.

The fourth stage is similarly arranged with TA and TA' connected to AND's 532 and 534, with inverters 538 and 540. The outputs of the AND's are connected, respectively to tens equality NOR 536 and to the fourth inputs of OR's 542 and 544.

The tens comparator tri-flop consists of three NAND's interconnected with three AND's, each having its output inverted and coupled to the inputs of the other two AND's. The tri-flop provides "state retention", i.e., the TRU, TRD, or TRE signals as indicated by the tens comparator. It also includes malfunction detection circuitry 69 for detecting varactor malfunctions which might occur under particular sets of operating conditions.

Assume the television receiver is turned on with a keyboard input of Band 1 channel. (As will be seen, Band 2 channels may have the same effect.) The logic circuit is fully activated very quickly. The tuner could experience weak or delayed oscillation under the operating conditions for the varactor diode enumerated previously and fail to produce the sufficient number of PS pulses to drive the counters far enough past their present positions. (The preset is 8 in the tens counter and 5 in the units counter for both Band 1 and Band 2 channels which, as far as the comparator is concerned, would look like channel 85 during the compare interval.) If channel 2 were selected, normally the modular scaler would deliver 17 CU transition pulses to the units counter which, with a 5 preset, would in turn deliver 2 CT transition pulses to the tens counter, leaving a units count of 2 and a tens count of 0. However, if only 14 CU pulses were received or counted, because of a temporary condition, such as low varactor diode voltage, the units count would register 9 and the tens counter, which would receiver only 1 CT pulse would register 9 and during the compare interval the oscillator frequency will be deemed to be much too high (channel 99) whereas in reality it isn't nearly high enough. Under these conditions, a ramp voltage down signal would be produced and prevent correction. As will be explained, to obviate this situation, under such conditions, the malfunction detection circuitry 69 forces a ramp up signal.

The output of tens counter OR 542, tens equality NOR 536 and tens memory OR 544 are connected to one input respectively of a NAND 548, a NAND 550 and a NAND 552. Timing signal $\bar{\phi}_1$ is coupled to the second inputs of the NAND's which are, therefore, enabled only during the compare interval when $\bar{\phi}_1$ is at a 1 level. The otput of NAND 548 is connected to inputs of an AND 558 and an AND 560; the output of NAND 550 to inputs of an AND 556 and AND 560; and the output of NAND 552 to inputs of AND 556 and AND 558. The output of AND 556 is connected to an input of an AND 572, and, through an inverter 555, to a third input of AND 558 and a third input of AND 560. The output of AND 560 is connected to one input of an OR 564 and through an inverter 559 to the fourth input of AND 558 and the third input of AND 556. The output of AND 558 (labelled TRE — tens ramp equal) is connected, through an inverter 557 to the fourth inputs of AND 556 and AND 560.

The operation of the various comparator stages will be described for (A) a memory bit of 0 and a corresponding counter bit of 1; (B) a memory bit of 1 and a counter bit of 0; and (C) memory and counter bits both 1 or 0. Thus, for the first stage TD is (A) 1, (B) 0 and (C) either 1 or 0, and TD' is (A) 0, (B) 1 and (C) either 1 or 0. With these values of TD and TD', the corresponding outputs from AND 500 and AND 504 are respectively (A) 1 and 0, (B) 0 and 1 and (C) 0 and 0. Thus, the output of AND 500 is at 1 only for condition (A) when the first stage bit in the tens counter is larger than the corresponding memory bit. This 1 level signal inhibits a 0 level output of tens counter OR 542, keeping its output at 1, which results in a 1 level ramp down signal. (AND 504 is at 0 and enables tens memory OR 544, keeping its output at 0 )

Similarly, AND 504 is at 1 only for condition (B) when the first stage tens memory bit is larger than the corresponding counter bit. AND 504 at 1 results in an input of tens memory OR 544 being at 1 which, in turn results in a 1 level ramp up (TRU) signal, thereby inhibiting a 0 level output signal. Correspondingly AND 500 enables OR 542 under condition (B) and inhibits NOR 505 which insures all other inputs to OR 542 are at 0 which maintains its output at 0. It may be seen that if either input to NOR 505 is at 1, its output will be at 0 and second stage AND's 508 and 510 and NOR 512 will be inhibited. For condition (C), the tens memory and counter first stage bits are equal and the outputs of AND 500 and AND 504 remain at 0 enabling both OR 542 and OR 544. The output of NOR 505 is now at 1 and enables second stage AND's 508 and 510 and, through inverter 511, NOR 512.

Thus an inequality in the tens comparator first bit stage inhibits the corresponding tens counter or memory OR gate from responding to later stages and produces a ramp control signal. The AND gates and NOR gates of the subsequent stages are inhibited until equality is achieved in the first bit stage. Conversely, whenever the first stage AND outputs are at 0, indicating equality, both counter and memory OR gates, and the second stage AND's and NOR are enabled transferring control of the tens counter and memory OR's to the next stage.

With the gates of the second stage enabled, the operation is the same with TC and TC' now being compared. Thus when TC is (A) 1, (B) 0 and (C) either 1 or 0, and TC' is (A) 0, (B) 1 and (C) either 1 or 0, the corresponding outputs of AND 508 and AND 510 are respectively (A) 1 and 0, (B) 0 and 1 and (C) 0 and 0. Thus, the output of AND 508 is at 1 only for condition (A) when the tens counter second stage bit is larger than the corresponding memory bit. The 1 level signal inhibits tens counter OR 542, keeping its output at 1, whereas AND 510 at 0 enables tens memory OR 544 in the same manner as the earlier stages. Similarly, AND 510 is at 1 for condition (B) and results in one of the inputs of OR 544 being at 1, thereby assuming a 1 level output signal.

For condition (C), TC and TC' are equal and the outputs of AND 508 and AND 510 are at 0. The output of NOR 512 is at 1 (whereas for (A) and (B), NOR 512 was at 0) and enables the third stage gates.

Bit equality in the second stage transfers control of the OR gates to the third stage and bit equality in the third stage transfers control to the fourth stage. When the bit comparison at the fourth stage indicates equality, the output of tens equality NOR 536 is at 1 and both the outputs of counter 542 and memory OR 544 are at 0. These signal levels are supplied to the tri-flop circuit. Note that the tens counter OR 542 is at 1, when condition (A) occurs at any stage that has control. Similarly, the output of tens memory OR 544 is at 1 when condition (B) occurs at any stage that has control. The output of NOR 536 is at 1 only under condition (C) (equality) in all 4 bit stages. (Only one of OR 542, OR 544 and NOR 536 can have a 1 level output at any given time.)

During the $\overline{\phi_1}$ compare interval, the three input NAND gates 548, 550 and 552 of the tri-flop are enabled to interrogate the status of tens comparator 51A. Each NAND output is normally at 1 (inhibited) and is at 0 only when both its inputs are at 1. Hence it may be seen that the corresponding outputs of NAND 548, NAND 550 and NAND 552, during $\overline{\phi_1}$ at 1, are respectively the inverses of the output signal levels of OR 542, NOR 536 and OR 544. Likewise, the outputs of AND 556, AND 568 and AND 560 may be shown to be identical with the outputs of OR 542, NOR 536 and OR 544, respectively, during the compare interval.

Assume OR 542 at 1, NOR 536 at 0, and OR 544 at 0. And 548 is at 0, and AND's 552 and 550 are at 1 which places two of the inputs of AND 556 at 1, whereas one input each of AND 558 and 560 is at 0. These latter AND's thus have their outputs at 0 and, through inverters 557 and 559, place the other two inputs of AND 556 at 1, which causes its output to be at 1, which in turn enables AND 572, and provides a TRD 1 level signal for energizing ramp voltage source 68.

The tens comparator operates continuously, but it is only "looked at" or interrogated when $\overline{\phi_1}$ is at 1, which allows the tri-flop NAND gates to respond to the output conditions of the tens memory and tens counter OR gates and the tens equality NOR gate. As will be discussed, the units comparator, works in conjunction with the modular comparator, which is also controlled by a tri-flop arrangement and interrogated during the compare interval.

The tri-flop also "retains" its tens state, i.e., ramp up (TRU at 1), ramp down (TRD at 1) or equality (TRE at 1) until the comparator indicates a change during a subsequent compare interval. To understand this retention assume the condition above with AND 556 at 1 and AND's 558 and 560 at 0. The 1 level output at AND 556 keeps one input of each of the other two AND's at 0 and thus inhibits them. They, in turn, through inverters 557 and 559, maintain two of the inputs of AND 556 at 1 (enabled). Its other two inputs are also normally held at 1 by NAND's 550 and 552. Thus when $\overline{\phi_1}$ goes to 0 (compare interval ends) AND 556 stays at 1 and the state of the tens comparator is retained.

Units Comparator 51B (FIG. 2)

The units comparator of FIG. 2 is also a four stage bit comparator similar to the tens comparator with the exception that it doesn't include a tri-flop or oscillator failure logic circuitry. The units comparator includes a units counter OR and a units memory OR for producing the units ramp down (URD) and units ramp up (URU) signals and units ramp equal (URE) signals for modular comparator 51C. The units OR's each have five inputs, one of which is inhibited by a 1 level TRD or TRU signal from the tens comparator. Thus the appropriate units transmission gate in the ramp voltage source is energized along with the corresponding tens transmission gates to increase the rate of change in voltage across the tuning capacitor and increase the ramp speed for inequalities in the tens digit. The tens comparator TRE signal enables the units comparator, while corresponding 0 level TRD and TRU signals turn off the transmission gates in ramp voltage source 68.

The TRD lead is connected to one input of units counter OR 648 and the TRU lead is connected to one input of units memory OR 650, thereby insuring that any inequality in the tens comparator overrides the units comparator and that the tens comparator is satisfied first. Control of the ramp voltage source is transferred from tens comparator 51A to the first stage of units comparator 51B by a TRE 1 level signal which is connected to one input of an AND 600, one input of an AND 604, and through an inverter 601, to one input of a NOR 62. UD from the counter is connected to a second output of AND 600 and, through an inverter 606, to a second input of AND 604 while UD' from the memory is connected to a third input of AND 604 and, through an inverter 608, to the third input of AND 600. The output of AND 600 connects to a second input of units counter OR 648 and to a second input of NOR 602. The output of AND 604 connects to a second input of units memory OR 650 and to the third input of NOR 602.

The units comparator second stage is the same, with the output of NOR 602 connected to AND 612, AND 616, and through inverter 613 to NOR 614. UC and UC' are connected to AND's 612 and 616 with inverters 618 and 620. AND's 612 and 616 connect to the third inputs of OR 648 and OR 650, respectively, and to NOR 614.

The third bit stage is also the same. Its gates are enabled by NOR 614 and its AND's 624 and 628 control OR's 648 and 650 and NOR 626 for transferring control to the next stage. Signals on leads UB and UB' from the counter and memory are compared in this stage.

In the fourth stage, which is enabled by NOR 626, the least significant bits in the units memory and counter are compared. As with previous stages, AND's 638 and 642 control the respective counter OR 648 and memory OR 650 and, a determination of equality operates the fourth stage NOR 640. The output of units counter OR 648 is labelled URD, the output NOR 640 is labelled URE and the output of units memory OR 650 is labelled URU.

The operation of the units comparator is the same as that previously described for the tens comparator except that its control of the ramp voltage source is solely through the modular comparator. The OR gate output signals URD and URU as well as the output signal of NOR 640 are thus applied to modular comparator 51C. Also, while the memory and counter binary bits are compared continually in all stages, only the most significant stage has control of the respective OR gates.

Modular Comparator 51C (FIG. 2)

The modular comparator 51C monitors two leads from modular scaler 62 to determine its state or residue. If the residue is acceptable as discussed previously with respect to the window, as described in the Tanaka application, and if equality in both units and tens counters exists, the ramp voltage change is stopped. Unlike the previous comparator sections the modular comparator does not have four stages for binary bit comparison. Rather, it identifies the residue as being less than, equal to, or greater than, the two preselected residues and contains tri-flop circuitry to retain this information. The comparator circuitry consists of 3 AND's, 2 OR's and two inverters appropriately interconnected and supplied with signals from the units comparator and modular scaler. The tri-flop is identical with the one in the tens comparator and has three NAND's, three AND's and three inverters.

As was true for the units comparator, the modular comparator is "overridden" when an inequality exists between the units digit (or tens digit) in the counter and that in the memory. Thus, OR 712 is supplied with the overriding URD signal and OR 710 supplied with the overriding URU signal and the modular comparator AND gates are enabled by the URE signal. Thus a determination of inequality in the units comparator is passed through the OR gates and the modular comparator AND gates are inhibited by URE being at a 0 level.

Lead URE is connected to one input each of an AND 700, an AND 702 and an AND 704. Lead PC, the Q terminal of flip-flop 404 in modular counter 62, is connected to one input of AND 702, to a second input of AND 700 and, through an inverter 714, to one input of AND 704. Lead PB, the Q terminal of flip-flop 402, is connected to the third input of AND 700 and, through an inverter 716, to the third input of AND 702. The outputs of AND's 702 and 704 connect to the second inputs of OR's 712 and 710, respectively.

The tri-flop NAND's 720, 722 and 724, each have one input connected to the outputs of OR 712, AND 700 and OR 710, respectively, and one input supplied by $\bar{\phi}_1$. The output of NAND 720 is connected to one input each of an AND 728 and an AND 730, the output of NAND 722 connects to one input each of an AND 726 and AND 730, and the output of NAND 724 to one input each of AND 728 and AND 726. The output of AND 726 labelled RD (ramp down), is connected through an inverter 725 to a third input of AND 728 and to the third input of AND 730. Similarly the outputs of AND 728 and AND 730 are connected through inverters 727 and 729 to the inputs of the other two AND's. The output of AND 730 is labelled RU (ramp up). The RU and RD leads are connected respectively to transmission gates 256 and 264 in the ramp voltage source of FIG. 7.

Assume equality in the tens and units comparators for the following examples. The tens comparator signals TRD and TRU and the units comparator signals URD and URU are all at 0 and the TRE and URE signals are at 1, the latter enabling the gates of modular comparator 51C. The state of the modular comparator is determined by the residue in modular scaler 62. As discussed in the Tanaka application, the window is defined by accepting residues corresponding to the 4th and 5th states. It thus remains to determine the relationship of the actual scaler residue to these acceptable states. The Q outputs of both flip-flops 402 and 404 are at 1 only when counter 62 is in states 4 and 5. Under these conditions, modular comparator 51C should designate RU and RD signals at a 0 level, i.e., no ramp change. For residues corresponding to state 6, and RD 1 level signal should be generated and for states of 3 or less an RU 1 level signal should be produced.

For residue values corresponding to states 4 and 5, both PC and PB are at 1 levels, and the output of AND 700 is at 1. PB, through inverter 716, supplies a 0 level signal to AND 702, thus causing the output of OR 712 to be at 0. PC through inverter 714 inhibits AND 704 and its output is at 0, assuring that the output of OR 710 is then also at 0. $\overline{\phi_1}$ at 1 during the compare interval enables NAND 722. The modular tri-flop operates in the same manner as the tens comparator tri-flop, in that the input levels are duplicated at the outputs of the tri-flop and maintained until the next compare interval. Thus, the output of AND 728 is at 1 indicating equality. Correspondingly, the RU and RD signals are at 0.

When the tuner is a little too high in frequency (above the range of frequencies defined by the window, but not high enough to change the equality states in the units comparator) the modular scaler is in state 6 and an RD 1 level signal is needed. For this condition, PC is at 1 and PB is at 0. PC inverted places a 0 level at an input of AND 704, forcing its output to a 0 level and operating OR 710, whose output assumes a 0 level. PB at 0 inhibits AND 700 and its output is also at 0. The inverted PB signal at the input of AND 702, in conjunction with the 1 level PC and URE signals place its output at 1 which inhibits OR 712, thus resulting in a 1 level output and 1 level RD signal.

For tuning slightly below the range of frequencies defined by the window the counter states may be 1, 2, or 3 for which PC is at 0. PC at 0 activates AND 704 and results in a 1 level output at OR 710 which produces a 1 level RU signal. PC at zero inhibits AND 702 and AND 700 insuring that only an RU signal is produced. Thus the system tuning is satisfied only for signals corresponding in frequency to the frequencies determined by the tens and units counters and modular scaler residues. The system AFC can then lock onto the received signal picture carrier and maintain tuning.

Malfunction Detection Means 69 (FIG. 2)

Malfunction detection circuitry 69 detects a low count from the counting means (which is translated into a low number of CU pulses) and overrides the correction dictated by the comparator by forcing a ramp up signal when in bands 1 and 2.

The malfunction detection circuitry includes an AND 568 and a pair of inverters 566 and 570. A BA signal from band decoder 52 is coupled through inverter 566 to one input of AND 568 and its second input is supplied with a TD signal from tens counter 66. The output of AND 568 is connected to the second input of OR 564 and, through inverter 570, to the second input of AND 572. The output of OR 564 is labelled TRU — tens ramp up and the output of AND 572 is labelled TRD — tens ramp down. Thus, AND 568 is supplied with tens counter bit signal TD and with an inverted band decoder signal BA, which is at 0 for channels occuring in Bands 1 and 2. If a Band 1 or 2 channel is selected and an insufficient number of pulses are available to cause the tens counter to advance through 0 from its preset of 8, TD will remain at 1 during the compare interval, corresponding to a channel number of 80 or more in the counter, whereas the memory "requests" a channel number of less than 10. As mentioned the comparator output would normally drive the tuning voltage to the varactor diode even lower and perhaps to the point of extinguishing oscillation.

However, with both inputs to AND 568 at 1, its output is at 1 and inverter 570 supplies the second input of AND 572 with a 0 level inhibiting signal, thus preventing a 1 level TRD signal which would drive the ramp down. The 1 signal at the output of AND 568 is supplied to OR 564 which forces a 1 level TRU signal (irrespective of the condition of the other input of OR 564), resulting in an increase in tuning voltage supplied to the varactor diode.

Conversely, if TD is at 0, indicating that sufficient CU pulses have been received to place a 0 in the tens digit position the output of AND 568 is at 0, enabling OR 564 and, through inverter 570, enabling AND 572 and operation is returned to normal. For channel number inputs in Bands 3 and 4, BA is at 1, its inversion therefore inhibits AND 568, and the malfunction detection circuitry is ineffective.

The invention disclosed provides an all channel television varactor diode tuning system employing tuning frequency counting which includes malfunction detection circuitry for detecting the occurrence of an improper number of counts under certain conditions. This circuitry is enabled whenever a channel number in either of the two low VHF frequency bands is selected and operates by monitoring the tens digit of a counter in the tuning frequency counting means to determine when the counter has been advanced sufficiently beyond its preset value. The malfunction detection circuitry overrides the normal operation of the comparison means to force a ramp voltage drive to change the tuning frequency in a corrective direction.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. A television tuning control system comprising:
   a tuner having a varactor diode tuning element operating in several predetermined discrete frequency bands containing a plurality of fixed bandwidth signals indentified by assigned channel numbers;
   tuning frequency counting means, employing preset counts corresponding to said frequency bands and sampling the frequency of said varactor diode tuning element, for deriving from the frequency of said tunable element, information indicative of the channel number of the corresponding receivable television channel;
   channel number selection means;
   comparison means coupled between said tuning frequency counting means and said channel number selection means for comparing desired channel number information from said channel number selection means with derived channel number information from said tuning frequency counting means;
   tuning voltage means coupled between said varactor diode tuning element and said comparison means, for driving said tuning element to change frequency in response to said comparison means;
   channel band determination means coupled between said channel number selection means and said tuning frequency counting means for segregating selected channel numbers according to their location in said several predetermined discrete frequency bands and establishing said preset counts for said tuning frequency counting means; and
   malfunction detection means coupled between said counting means and said tuning voltage means for detecting an improper number of pulses from said counting means and forcing said tuning voltage means to drive said varactor diodes tuning element in a direction opposite to that indicated by said comparison means.

2. The television tuning control system of claim 1 wherein said malfunction detection means is also coupled to an output of said channel band determination means and enabled by said channel band determination means only for certain of said discrete frequency bands.

3. The television tuning control system of claim 2 wherein said improper number of pulses results from the occurrence of a low voltage condition for said varactor diode when in the first or lowest of said discrete frequency bands.

4. The television tuning control system of claim 3 wherein said malfunction detection means determines when said tuning frequency counting means has been advanced sufficiently beyond its preset value.

5. The television tuning control system of claim 4 wherein said channel number selection means includes means for binary encoding the individual digits of two digit channel numbers, and said malfunction detection means is responsive to one of said individual digits of the derived channel number.

6. The television tuning control system of claim 5 wherein said malfunction detection means is responsive to the tens digit of said derived channel number.

7. The television tuning control system of claim 6 wherein said malfunction detection means is responsive only to the highest order bit of said binary encoded tens digit of the derived channel number.

8. The television tuning control system of claim 7 wherein said malfunction detection means determines equality between the said highest order bit of said binary encoded tens digit and the corresponding bit of the preset count.

9. The television tuning control system of claim 8 wherein said comparison means includes a ramp increase and a ramp decrease output corresponding respectively to the comparison conditions for increasing and decreasing the frequency of said tunable element and said malfunction detection means includes logic means interconnected with said ouputs for overriding the normal signals generated by said comparison means.

10. The television tuning control system of claim 9 wherein said malfunction detection means comprises:
a first AND gate accepting a signal indicative of the selection of a first band channel and a signal representing said highest order bit of said tens digit of a derived channel number,
a second AND gate accepting an inverted signal from said first AND gate and a ramp decrease signal from said comparison means,
said first and second AND gates being interconnected with said comparison means to override the normal signals generated by said comparison means.

11. The television tuning control system of claim 10 wherein said malfunction detection means further comprises:
an OR gate accepting the output of said first AND gate and a ramp increase signal from the tens digit section of said comparison means,
and wherein said second AND gate accepts an inverted signal from said first AND gate and a ramp decrease signal from the tens digit section of said comparison means,
said first and second AND gates being interconnected with said comparison means to inhibit the generation of the normal tens section ramp decrease signal with the output of said OR gate supplying the tens section ramp increase signal.

* * * * *